United States Patent
Huh et al.

(10) Patent No.: US 11,316,238 B2
(45) Date of Patent: Apr. 26, 2022

(54) HIGH FREQUENCY FILM TRANSMISSION LINE, ANTENNA INCLUDING THE SAME AND ANTENNA-INTEGRATED IMAGE DISPLAY DEVICE

(71) Applicant: DONGWOO FINE-CHEM CO., LTD., Jeollabuk-do (KR)

(72) Inventors: Yoon Ho Huh, Seoul (KR); Han Sub Ryu, Gyeongsangbuk-do (KR); Yun Seok Oh, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 161 days.

(21) Appl. No.: 16/552,006

(22) Filed: Aug. 27, 2019

(65) Prior Publication Data
US 2020/0076035 A1    Mar. 5, 2020

(30) Foreign Application Priority Data
Aug. 30, 2018  (KR) .................. 10-2018-0102865

(51) Int. Cl.
*H01Q 1/38* (2006.01)
*H01P 3/08* (2006.01)
*H01Q 1/22* (2006.01)
*H05K 1/18* (2006.01)
*H05K 1/02* (2006.01)

(52) U.S. Cl.
CPC .............. *H01P 3/082* (2013.01); *H01Q 1/22* (2013.01); *H01Q 1/38* (2013.01); *H05K 1/0243* (2013.01); *H05K 1/181* (2013.01)

(58) Field of Classification Search
CPC ........... H01Q 1/38; H01Q 1/46; H01Q 1/243; H01Q 1/364; H01P 3/082; H05K 1/0243
See application file for complete search history.

(56) References Cited

U.S. PATENT DOCUMENTS

| | | | | |
|---|---|---|---|---|
| 5,563,616 A | * | 10/1996 | Dempsey | H01Q 9/285 343/756 |
| 2004/0174228 A1 | * | 9/2004 | Kanno | H05K 1/0219 333/34 |
| 2014/0218867 A1 | * | 8/2014 | Kim | B32B 9/045 361/704 |
| 2018/0359845 A1 | * | 12/2018 | Park | H01Q 1/243 |
| 2019/0023899 A1 | * | 1/2019 | Tanigawa | H01P 3/026 |
| 2019/0241284 A1 | * | 8/2019 | Benward | G01R 27/04 |

FOREIGN PATENT DOCUMENTS

| | | |
|---|---|---|
| CN | 101895010 A | 11/2010 |
| CN | 102076774 A | 5/2011 |
| CN | 108039557 A | 5/2018 |
| KR | 10-2004-0052561 A | 6/2004 |
| KR | 10-2011-0008286 A | 1/2011 |
| KR | 10-2011-0071368 A | 6/2011 |
| KR | 10-2016-0059291 A | 5/2016 |
| KR | 10-2016-0080444 A | 7/2016 |

* cited by examiner

Primary Examiner — Tung X Le
(74) Attorney, Agent, or Firm — The PL Law Group, PLLC

(57) ABSTRACT

A film transmission line includes a dielectric layer including at least one of a liquid crystal polymer (LCP) structure or a cyclo olefin polymer (COP) structure, and an electrode line on the dielectric layer. A signal loss level (S21) defined of the film transmission line is −1.5 dB or more at a frequency in a range from 20 GHz to 30 GHz. The film transmission line may be applied to a high frequency thin film antenna and an image display device.

17 Claims, 5 Drawing Sheets

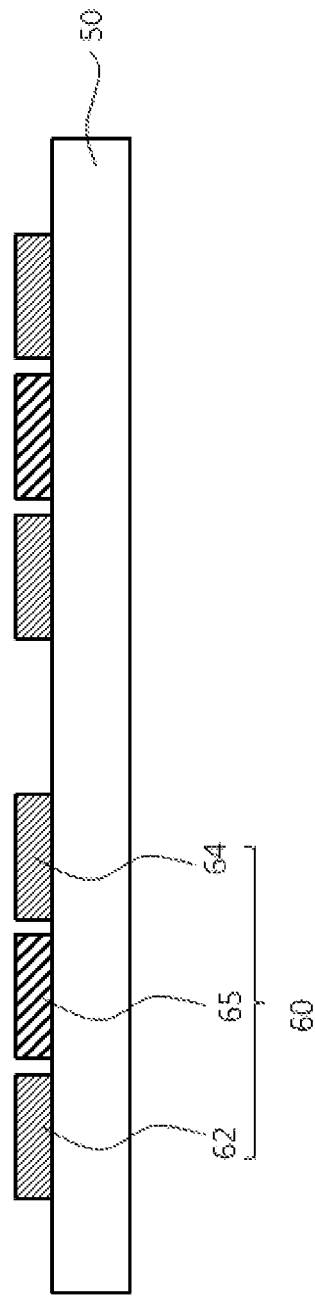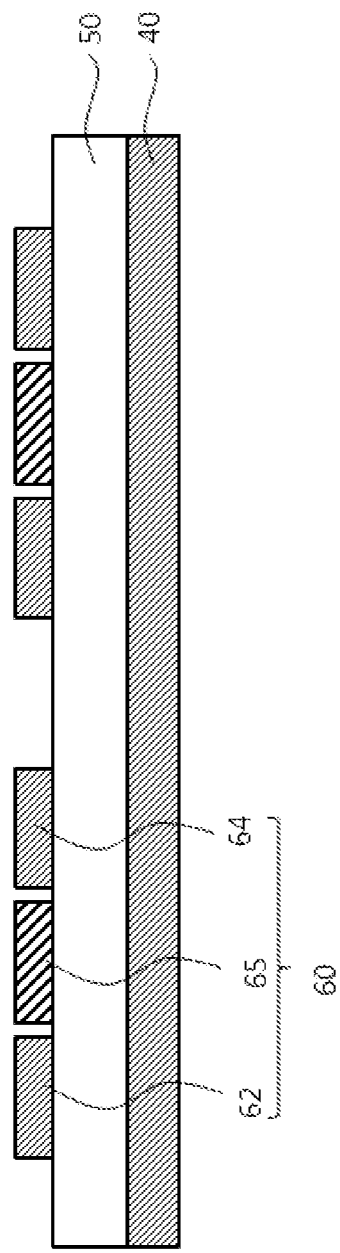

HIGH FREQUENCY FILM TRANSMISSION LINE, ANTENNA INCLUDING THE SAME AND ANTENNA-INTEGRATED IMAGE DISPLAY DEVICE

CROSS-REFERENCE TO RELATED APPLICATION(S)

This application claims the benefit under 35 USC § 119(a) of Korean Patent Application No. 10-2018-0102865 filed on Aug. 30, 2018, in the Korean Intellectual Property Office, the entire disclosure of which is incorporated herein by reference for all purposes.

BACKGROUND

1. Field

The present invention relates to a high frequency film transmission line, an antenna including the same and an antenna-integrated image display device.

2. Description of the Related Art

As information technologies have been developed, a wireless communication technology such as Wi-Fi, Bluetooth, etc., is combined with a display device in, e.g., a smartphone. In this case, an antenna may be combined with the display device to provide a communication function.

Mobile communication technologies have been rapidly developed, an antenna capable of operating an ultra-high frequency communication is needed in the display device. Further, various communication functions are implemented in one display device, and thus a combination of a plurality of antennas that may be responsive to different frequencies are required in the display device.

The plurality of the antennas may be connected to each other via an antenna wiring such as a transmission line. However, as various driving circuit chips, a memory device, a sensor chip, etc., are integrated in the display device, a space or an area for arranging the antenna wiring may be decreased. Accordingly, a path via the antenna wiring may be bypassed and a length of the antenna wiring may be increased to result in an increase of a signal resistance.

Further, various wiring structures such as a resistor, a capacitor, a condenser, etc., may be included in the display device, and an antenna signal may interrupted or interfered by a noise from the circuit structure.

Therefore, construction of the antenna and wirings providing improved signal transfer reliability in a compact size may be needed while minimizing the interference from the noise.

For example, Korean Published Patent Application No. 2016-0059291 discloses an antenna integrated in a display panel, however, fails to suggest sufficient solutions of the above-mentioned issues.

SUMMARY

According to an aspect of the present invention, there is provided a high frequency film transmission line having improved signaling efficiency and reliability.

According to an aspect of the present invention, there is provided an antenna including the high frequency film transmission line.

According to an aspect of the present invention, there is provided an image display device integrated with an antenna having improved signaling efficiency and reliability.

The above aspects of the present invention will be achieved by the following features or constructions:

(1) A film transmission line, comprising: a dielectric layer including at least one of a liquid crystal polymer (LCP) structure or a cyclo olefin polymer (COP) structure; and an electrode line on the dielectric layer, wherein a signal loss level (S21) defined as Equation 1 below of the film transmission line is −1.5 dB or more at a frequency in a range from 20 GHz to 30 GHz:

$$S21\ (dB) = 10 \times Log(\text{Output power/Input power}). \quad [\text{Equation 1}]$$

(2) The film transmission line according to the above (1), wherein a dielectric constant of the dielectric layer is 3.4 or less.

(3) The film transmission line according to the above (1), wherein a loss tangent of the dielectric layer is 0.001 or less.

(4) The film transmission line according to the above (1), wherein the dielectric layer includes at least one of structural units represented by Chemical Formulae 1 to 5 below:

[Chemical Formula 1]

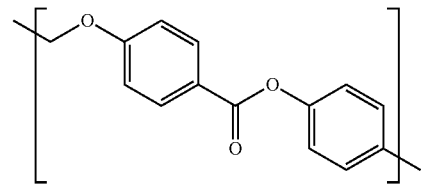

[Chemical Formula 2]

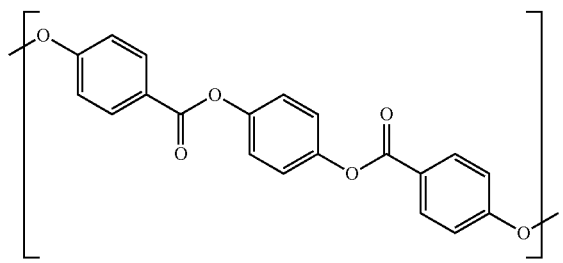

[Chemical Formula 3]

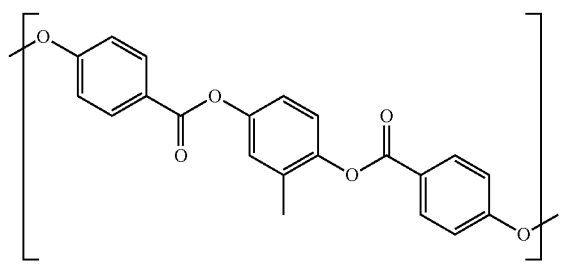

[Chemical Formula 4]

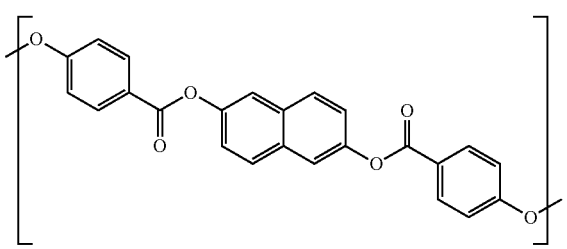

[Chemical Formula 5]

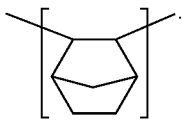

(5) The film transmission line according to the above (1), wherein a length of the electrode line is 40 mm or less.

(6) The film transmission line according to the above (1), wherein a thickness of the electrode line is 100 nm to 500 nm.

(7) The film transmission line according to the above (1), wherein the electrode line includes at least one selected from the group consisting of silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca) and an alloy thereof.

(8) The film transmission line according to the above (1), wherein the electrode line includes a signal line and a ground line.

(9) The film transmission line according to the above (8), wherein the ground line includes a first ground line and a second ground line, and the signal line is interposed between the first ground line and the second ground line.

(10) The film transmission line according to the above (1), wherein the electrode line includes a mesh structure.

(11) The film transmission line according to the above (10), further comprising a dummy pattern around the electrode line, wherein the dummy pattern includes a mesh structure the same as that of the electrode line.

(12) The film transmission line according to the above (1), further comprising a ground layer disposed on a lower surface of the dielectric layer.

(13) An antenna, comprising the film transmission line according to any one of the above (1) to (12); and an antenna electrode electrically connected to the film transmission line.

(14) An image display device, comprising: a printed circuit board; an antenna mounted on the printed circuit board; a display panel disposed over the printed circuit board; and the film transmission line according to any one of the above (1) to (12) disposed on the display panel and electrically connected to the antenna.

(15) The image display device according to the above (14), further comprising an electronic device mounted on the printed circuit board.

(16) The image display device according to the above (14), further comprising a connection structure electrically connecting the film transmission line and the antenna to each other.

(17) The image display device according to the above (16), wherein the connection structure includes a flexible printed circuit board (FPCB).

(18) The image display device according to the above (17), wherein the connection structure is connected to an end portion of the electrode line included in the film transmission line, and the connection structure extends toward the printed circuit board via a peripheral region of the image display device to be connected to the antenna.

According to exemplary embodiments of the present invention, a film transmission line may include an electrode line disposed on a dielectric layer including a liquid crystal polymer (LCP) or a cyclo olefin polymer (COP). The LCP or COP may have remarkably low loss tangent relatively to other insulation or dielectric materials, and thus low signal loss level may be maintained even though a length of the electrode line is increased.

In some embodiments, a plurality of antennas may be connected by the film transmission line. Thus, signal loss between the plurality of the antennas may be prevented and a size of an antenna structure may be reduced. In some embodiments, the film transmission line and the antenna may be isolated from each other at different layers or different levels with respect to a display panel of an image display device. Thus, the transmission line may be arranged without spatial limitation by a display driving integrated circuit (IC) chip, a memory device, etc., disposed on a printed circuit board (PCB) of the image display device.

Therefore, signal loss through the transmission line may be reduced, and interference or disturbance by noises from a circuit device or an electronic device on the printed circuit board may be removed or reduced.

BRIEF DESCRIPTION OF THE DRAWINGS

FIGS. 1 and 2 are schematic cross-sectional views illustrating film transmission lines in accordance with exemplary embodiments.

DETAILED DESCRIPTION

Figure 3:
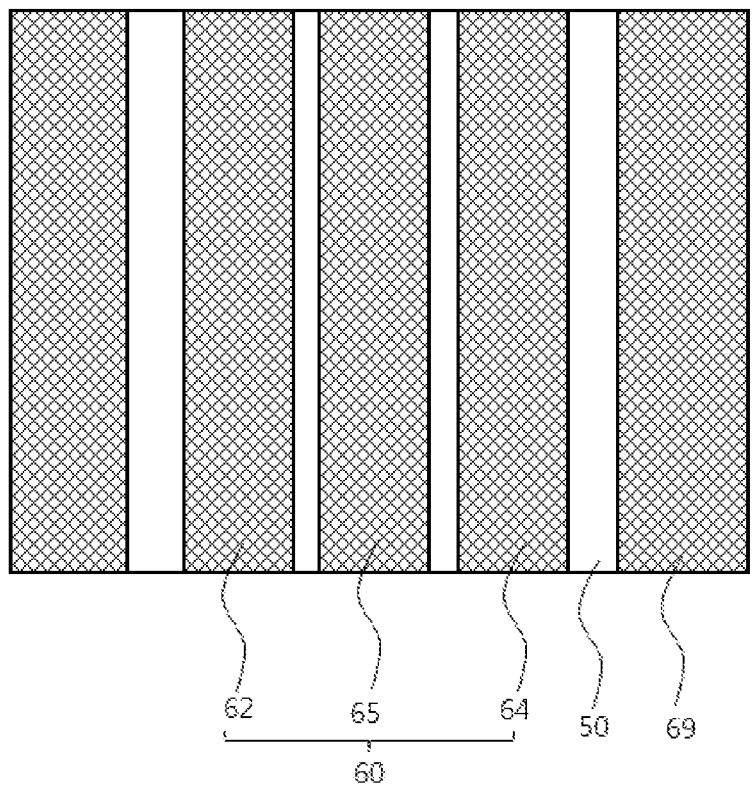
FIG. 3 is a schematic top planar view illustrating a film transmission line in accordance with some exemplary embodiments.

According to exemplary embodiments of the present invention, a film transmission line including a dielectric layer that may include an LCP structure and/or a COP structure and having improved signaling efficiency is provided. Further, an antenna and an image display device combined with the film transmission line are provided. For example, the film transmission line may be applied to the antenna and the image display device for implementing 3G to 5G high frequency mobile communication.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

FIGS. 1 and 2 are schematic cross-sectional views illustrating film transmission lines in accordance with exemplary embodiments.

Referring to FIG. 1, the film transmission line may include a dielectric layer 50 and an electrode line 60 disposed on the dielectric layer 50.

In exemplary embodiments, the dielectric layer 50 may include a liquid crystal polymer (LCP) structure and/or a cycle olefin polymer (COP) structure.

In some embodiments, the dielectric layer 50 may include a polymer material selected from LCP and/or COP having a dielectric constant of about 3.4 or less. In an embodiment, the dielectric constant of the dielectric layer may be in a range from about 1.5 to 3.4. In an embodiment, the film transmission line may be operated at a high frequency of about 5 GHz or more, preferably about 20 GHz or more.

A plurality of aromatic units and multi-aliphatic rings may be included in the LCP structure and the COP structure, respectively, to have improved mechanical and structural stability. Further, the aromatic unit and the multi-aliphatic ring may be combined rotatably so that a local deviation of a dielectric polarization may be reduced.

Thus, the dielectric layer 50 including the LCP and/or the COP structure according to exemplary embodiments may have a remarkably low loss tangent value. Therefore, a signal loss may be prevented even though the length of the electrode line 60 may be increased.

In exemplary embodiments, the loss tangent of the dielectric layer 50 may be 0.001 or less.

For example, the LCP structure included in the dielectric layer 50 may include at least one of structural units represented by Chemical Formulae 1 to 4.

[Chemical Formula 1]

[Chemical Formula 2]

[Chemical Formula 3]

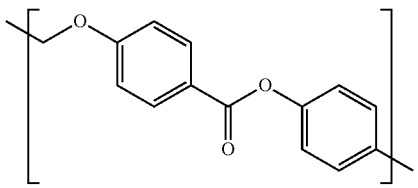
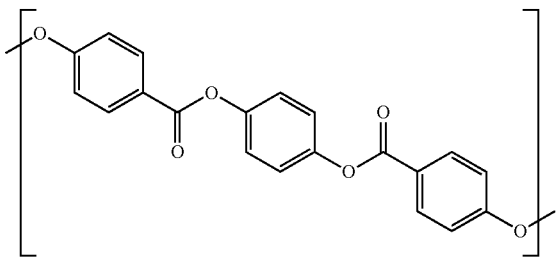
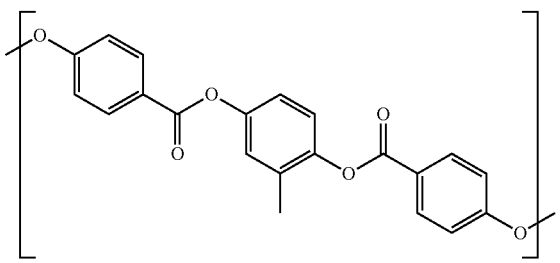

[Chemical Formula 4]

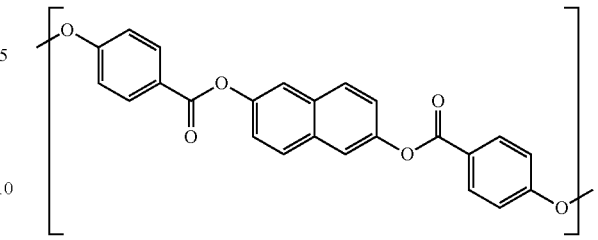

For example, the COP structure included in the dielectric layer 50 may include a structural unit represented by Chemical Formula 5.

[Chemical Formula 5]

In some embodiments, the dielectric layer 50 may include at least one of the structural units of Chemical Formulae 1 to 4, and the structural unit of Chemical Formula 5. In this case, the dielectric layer 50 may include both the LCP structure and the COP structure.

The electrode line 60 may be connected to an antenna to serve as a signal line for a signal transfer or a feeding line.

The electrode line 60 may include a low-resistance metal such as silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca), or an alloy thereof. These may be used alone or in a combination thereof.

Preferably, the electrode line 60 may include silver or a silver-containing alloy, copper or a copper-containing alloy, or an alloy containing silver and copper. For example, the electrode line 60 may include a silver-palladium-copper (APC) alloy.

In some embodiments, the electrode line 60 may include a mesh structure formed of the metal or the alloy.

In some embodiments, the electrode line 60 may include a signal line 65 and ground lines 62 and 64. In some embodiments, the signal line 65 may be interposed between a pair of the ground lines, e.g., between the first ground line 62 and the second ground line 64. The signal line 65, the first ground line 62 and the second ground line 64 may be substantially parallel to each other.

The signal line 65, and the first and second ground lines 62 and 64 may define one of the electrode lines 60. In some embodiments, a plurality of the electrode lines 60 may be arranged on the dielectric layer 50.

In some embodiments, a thickness of the electrode line 60 may be in a range from about 100 nm to about 500 nm. The thickness of the electrode line 60 may indicate each thickness of the signal line 65, the first ground line 62 and the second ground line 64, preferably may be a thickness of the signal line 65.

If the thickness of the electrode line 60 is less than about 100 nm, a resistance and a signal loss level of the electrode line 60 may be excessively increased. If the thickness of the electrode line 60 exceeds about 500 nm, a signal efficiency or a signal transfer speed may not be further improved, and an only entire thickness of the film transmission line may be increased.

In some embodiments, a target signal loss level of the film transmission line or an antenna including the same may be −1.5 dB (the signal loss level is −1.5 dB or more, or 0 to −1.5 dB).

The signal loss level (S21) may be obtained by the following Equation 1.

$$S21 \text{ (dB)} = 10 \times \text{Log(Output power/Input power)} \quad \text{[Equation 1]}$$

In some embodiments, the film transmission line or the antenna including the same may have S21 of −1.5 dB or more at a frequency of 20 GHz or more (e.g., 28.5 GHz) with a length of the electrode line 60 of 40 mm.

As described above, the dielectric layer 50 may include the LCP and/or the COP structure having the low loss tangent value so that signal transfer efficiency may be improved even when the length of the electrode line 60 is increased at a high frequency.

Referring to FIG. 2, the electrode line 60 may be disposed on an upper surface of the dielectric layer 50, and a ground layer 40 may be disposed on a lower surface of the dielectric layer 50.

In some embodiments, various conductive members of an image display device to which the film transmission line may be applied may serve as the ground layer 40. The conductive members may include various wirings such as a gate electrode in a thin film transistor (TFT) included in a display panel, a scan line or a data line, or various electrodes such as a pixel electrode, a common electrode, etc.

FIG. 3 is a schematic top planar view illustrating a film transmission line in accordance with some exemplary embodiments.

Referring to FIG. 3, as described with reference to FIGS. 1 and 2, the electrode line 60 may be disposed on the dielectric layer 50, and the electrode line 60 may include a mesh structure.

In exemplary embodiments, a dummy pattern 69 may be disposed on the dielectric layer 50 around the electrode line 60. The dummy pattern 69 may be spaced apart from the electrode line 60 with a predetermined distance to be electrically and physically separated from the electrode line 60.

The dummy pattern 69 may include a mesh structure substantially the same as or similar to that of the electrode line 60. For example, the dummy pattern 69 may be formed of a material the same as that of the electrode line 60, and may have a line width and an aperture ratio substantially the same as those of the electrode line 60. Thus, an optical deviation by the electrode line 60 may be reduced so that the electrode line 60 may be prevented from being viewed by a user of the image display device.

Figure 4:
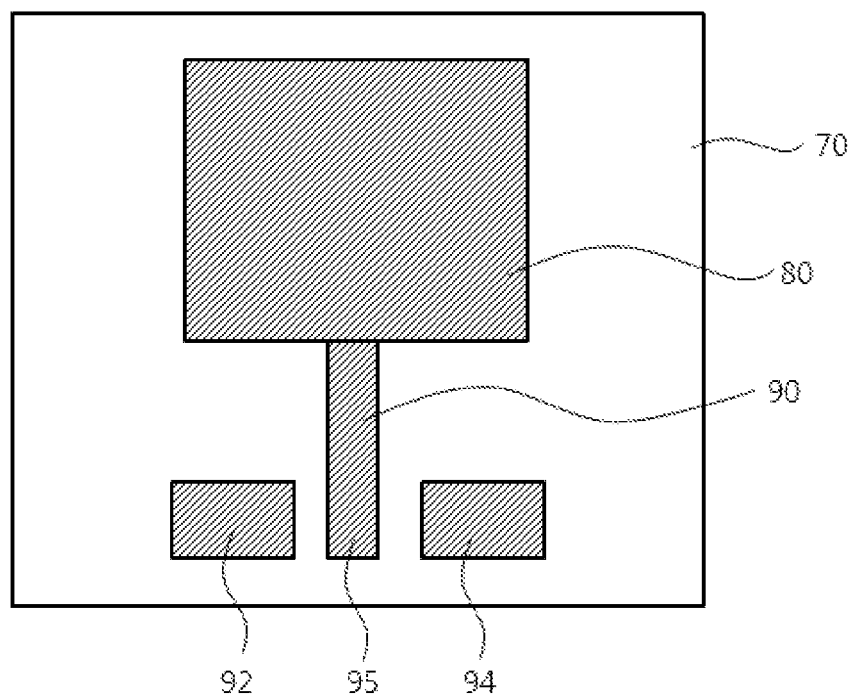
FIG. 4 is a schematic top planar view illustrating a structure of an antenna electrode in accordance with some exemplary embodiments.

FIG. 4 is a schematic top planar view illustrating a structure of an antenna electrode in accordance with some exemplary embodiments.

Referring to FIG. 4, the antenna electrode combined with the film transmission line may include a radiation electrode 80, a signal pad 95 and ground pads 92 and 94. For example, the antenna electrode may be disposed on an insulation substrate 70, and the insulation substrate 70 may serve as a dielectric layer of the antenna electrode.

The antenna electrode may include a metal or an alloy substantially the same as or similar to those of the electrode line 60. In some embodiments, the antenna electrode may include a mesh structure. In this case, a dummy mesh pattern may be arranged around the antenna electrode.

The signal pad 95 may be electrically connected to the radiation electrode via a feeding line 90. For example, an end portion of the feeding line 90 may serve as the signal pad 95. In some embodiments, the feeding line 90 may be diverged from the radiation electrode 80, and may serve as a unitary member integrally connected to the radiation electrode 80.

In some embodiments, the signal pad 95 may be interposed between the first ground pad 92 and the second ground pad 94. The antenna electrode may be electrically connected to the electrode line 60 of the film transmission line as described with reference to FIGS. 1 to 3. In this case, the signal line 65, the first ground line 62 and the second ground line 64 may be electrically connected to the signal pad 95, the first ground pad 92 and the second ground pad 94, respectively, of the antenna electrode.

In an embodiment, the antenna electrode and the film transmission line may be connected to each other via a conductive member such as a flexible printed circuit board (FPCB).

Figure 5:
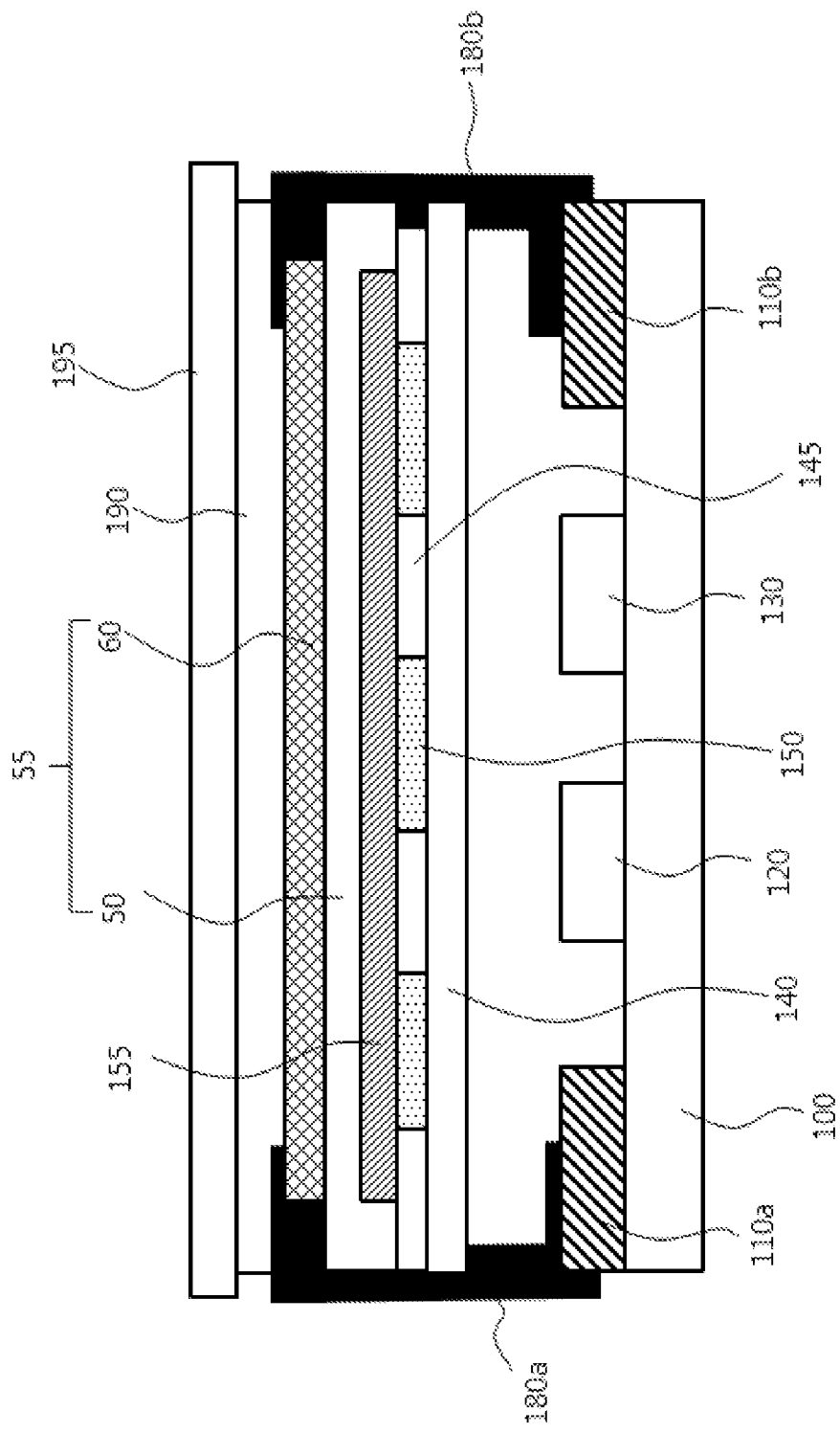
FIG. 5 is a schematic cross-sectional view illustrating an image display device in accordance with exemplary embodiments.

FIG. 5 is a schematic cross-sectional view illustrating an image display device in accordance with exemplary embodiments.

Referring to FIG. 5, the image display device may include a printed circuit board (PCB) 100 and a display panel 140, and may include antennas 110a and 110b mounted on the PCB 100, and a film transmission line 55 disposed on the display panel 140.

The PCB 100 may include insulation layers and metal layers forming internal circuits which may be repeatedly stacked. Connection pads such as solders for connecting an electronic device and the internal circuit may be formed on the PCB 100. For example, the PCB 100 may serve as a main board of the image display device.

The electronic device and the antennas 110a and 110b may be mounted on the PCB 100 via, e.g., the connection pads. In some embodiments, the electronic device and the antennas 110a and 110b may be arranged on a bottom surface of the PCB 100. In an embodiment, the electronic device and the antennas 110a and 110b may be distributed on top and bottom surfaces of the PCB 100.

A plurality of the antennas may be mounted on the PCB 100. The plurality of the antennas may include antennas having different resonance frequencies.

For example, the first antenna 110a and the second antenna 110b may be separated from each other on the PCB 100, and three or more antennas may be mounted on the PCB 100.

As described with reference to FIG. 4, the antennas 110a and 110b may each include the antenna electrode that may include the radiation electrode, the signal pad and the ground pad. The signal pad and the ground pad may be connected to the electrode line 60 included in the film transmission line 55 and may be also connected to the internal circuit of the PCB 100.

The antennas 110a and 110b may be mounted on the PCB 100 as an antenna patch or an antenna chip.

The electronic device may include, e.g., a display driving integrated circuit (IC) chip 120, a memory device 130, etc. The memory device 130 may include, e.g., a RAM device or a flash memory device.

The electronic device may include an IC chip configured to drive various sensor devices included in the image display device. For example, the electronic device may include a driving IC chip for a touch sensor or a touch screen panel.

The electronic device may include various circuit structures of the image display device such as a resistor, a capacitor, a condenser, etc.

The display panel 140 may be disposed on the PCB 100. In exemplary embodiments, the PCB 100 and the display panel 140 may be spaced apart from each other with a predetermined distance.

For example, the PCB 100 and the display panel 140 may be fixed by a housing or a bezel of the image display device so that an separation space may be defined between the PCB 100 and the display panel 140.

In an embodiment, an insulation structure such as an adhesive layer, a spacer, etc., may be disposed in the separation space.

A portion of the image display panel below the display panel 140 may be a rear-face portion at which the PCB 100 on which the antennas 110a and 110b and the electronic device may be mounted may be disposed. A portion of the image display device over the display panel 140 may be a front-face portion from which an image may be displayed.

The display panel 140 may include, e.g., a thin film transistor (TFT) array substrate. For example, the TFT array substrate may include a base substrate such as a glass substrate or a resin substrate, and a TFT, a scan line, a data line, etc., arranged on the base substrate.

The display panel 140 may include a pixel defining layer 145 and a display layer 150 arranged on the TFT array substrate. For example, a pixel electrode included in the TFT may be partially exposed by the pixel defining layer 145 to define a pixel, and the display layer 150 may be formed on a surface of the exposed pixel electrode.

The pixel defining layer 145 may include an inorganic insulation material or an organic insulation material. The display layer 150 may include, e.g., an organic light emitting layer or a liquid crystal layer. If the display layer 150 includes the organic light emitting layer, the image display device may be provided as an organic light emitting diode (OLED) display device. In this case, the display layer 150 may further include a hole transfer layer, an electron transfer layer, etc.

If the display layer 150 includes the liquid crystal layer, the image display device may be provided as a liquid crystal display (LCD) device. In this case, a back-light, a polarizing plate, etc., may be further included between the display panel 140 and the PCB 100.

A reflective electrode 155 may be disposed on the display layer 150. For example, the reflective electrode 155 may serve as a common electrode extending on a plurality of the display layers 150 or the pixels.

The film transmission line 55 as described with reference to FIGS. 1 to 3 may be disposed on the display panel 140. The film transmission line 55 may include the dielectric layer 50 and the electrode line 60. The electrode line 60 may include the signal line 65 and the ground lines 62 and 64 as described with reference to FIG. 1.

The electrode line 60 may be electrically connected to the antennas 110a and 110b to serve as a feeding and signaling path between an antenna driving IC chip and the antennas 110a and 110b.

In exemplary embodiments, the electrode line 60 disposed over the display panel 140 and the antennas 110a and 110b disposed under the display panel 140 may be electrically connected to each other by connection structures 180a and 180b.

In some embodiments, the electrode line 60 and the first antenna 110a may be connected to each other by the first connection structure 180a, and the electrode line 60 and the second antenna 110b may be connected to each other by the second connection structure 180b. Accordingly, the first and second antennas 110a and 110b disposed under the display panel 140 may be electrically connected or coupled by the electrode line 60.

Even though a length of the electrode line 60 is increased for connecting the first and second antennas 110a and 110b, a stable signaling efficiency may be obtained from the dielectric layer 50 including the above-mentioned LCP and/or COP structure and having reduced loss tangent property.

The connection structures 180a and 180b may include a metal wire or a flexible printed circuit board (FPCB).

As illustrated in FIG. 5, if the antennas 110a and 110b are mounted on a top surface of the PCB 100, one end portions of the connection structures 180a and 180b may extend on the display panel 140 to be connected to an end portion of the electrode line 60. The other end portions of the connection structures 180a and 180b may be bent between the display panel 140 and the PCB 100 to be connected to the antennas 110a and 110b. For example, the other end portions of the connection structures 180a and 180b may be electrically connected to the signal pad and/or the ground pad included in the antennas 110a and 110b.

In some embodiments, if the antennas 110a and 110b are mounted to a bottom surface of the PCB 100, the connection structures 180a and 180b may extend from the end portion of the electrode line 60 to the bottom surface of the PCB 100 to be connected to the antennas 110a and 110b.

An encapsulation layer 190 may be formed on the film transmission line 55. The encapsulation layer 190 may be formed of an inorganic insulation material such as silicon oxide, silicon nitride, etc., an organic insulation material such as an acryl-based resin, an imide-based resin, etc., or an organic-inorganic hybrid film.

A window substrate 195 may be disposed on the encapsulation layer 190. The window substrate 195 may provide a viewer surface of the image display device.

In some embodiments, the image display device may further include a sensor structure such as a touch sensor or a touch screen panel, or an optical structure such as a polarizing plate, a retardation film, etc.

The sensor structure or the optical structure may be interposed between the window substrate 195 and the film transmission line 55. Alternatively, the sensor structure or the optical structure may be interposed between the film transmission line 55 and the display panel 140.

Preferably, the sensor structure or the optical structure may be interposed between the window substrate 195 and the film transmission line 55 so that a length of a signal path via the film transmission line 55 may be decreased, and a signal receiving sensitivity may be improved.

According to exemplar embodiment as described above, the antennas 110a and 110b and the film transmission line 55 may be disposed at different levels to be spaced apart from each other with respect to the display panel 140. Thus, the film transmission line 55 may be placed without a spatial limitation from the electronic device such as the display driving IC chip 120, the memory device 130, etc., an thus the length of the signal path may be reduced so that resistance increase and signal loss through the film transmission line 55 may be prevented.

Figure 6:
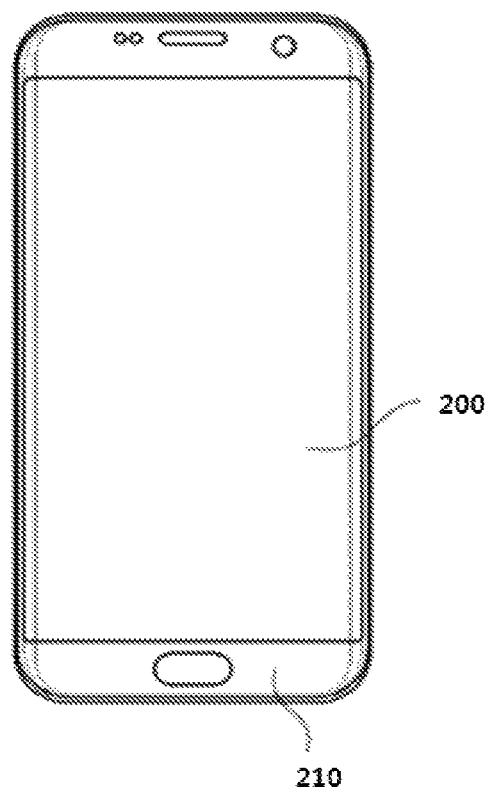
FIGS. 6 and 7 are schematic top planar views illustrating an image display device in accordance with exemplary embodiments.
Figure 7:
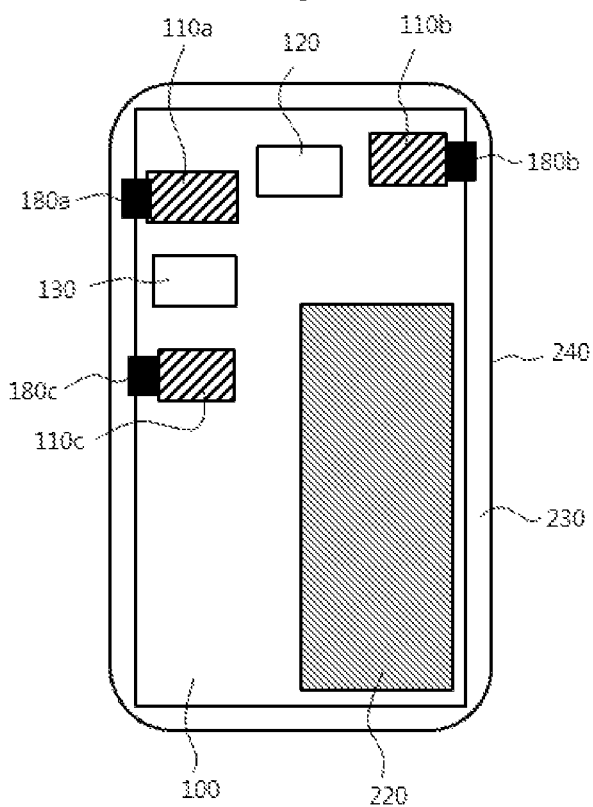

FIGS. 6 and 7 are schematic top planar views illustrating an image display device in accordance with exemplary embodiments.

Referring to FIGS. 6 and 7, the image display device may include a display region 200 and a peripheral region 210 at a front-face portion. An image generated from the display panel illustrated in FIG. 5 may be displayed to a user through the display region 200. The film transmission line 55 may be disposed on the display panel 140. In an embodiment, the electrode line 60 may include a substantially transparent mesh structure to prevent degradation of an image quality.

The peripheral region 210 may correspond to both end portions and both lateral portions around the display region 200. The peripheral region 210 may include a bezel region 230 between a housing 240 of the image display device and the PCB 100.

The antennas 110a, 110b and 110c may be mounted on the PCB 100 together with the electronic devices 120 and 130. Further, a battery 220 may be also combined with PCB 100.

As described with reference with FIG. 5, the connection structures 180a, 180b and 180c such as a flexible printed circuit board (FPCB) may each be connected to the electrode line 60 disposed on the display panel 140 and may extend toward the PCB 100 to be connected to the antennas 110a, 110b and 110c through the bezel region 230. Accordingly, the antennas 110a, 110b and 110c may be electrically connected to each other via the electrode line 60 of the film transmission line 55, and feeding and controlling may be implemented commonly by, e.g., an antenna driving IC chip.

The connection structures 180a, 180b and 180c may be connected to the antennas 110a, 110b and 110c via the bezel region 230, and thus an image display in the display region 200 may not be interrupted. Additionally, the antennas 110a, 110b, 110c and the film transmission line 55 may be connected to each other without a limitation from an arrangement of the electronic devices 120 and 130 so that a length of a signal path may be decreased.

Hereinafter, preferred embodiments are proposed to more concretely describe the present invention. However, the following examples are only given for illustrating the present invention and those skilled in the related art will obviously understand that these examples do not restrict the appended claims but various alterations and modifications are possible within the scope and spirit of the present invention. Such alterations and modifications are duly included in the appended claims.

Experimental Example 1: Evaluation of Signal Property Depending on a Dielectric Material and a Length of an Electrode Line Electrode lines having a thickness of 0.24 μm and a width of 250 μm were formed using a silver-palladium-copper (APC) alloy on dielectric layers having a thickness of 50 μm and including different materials.

Specifically, LCP (dielectric constant: 3.0, loss tangent: 0.0008, Product name: R-F705S, Manufacturer: Panasonic), COP (dielectric constant: 2.25, loss tangent: 0.0008, Product name: ZF16, Manufacturer: ZEONEX), polyimide (PI) (dielectric constant: 3.0, loss tangent: 0.01, Product name: E1208 D500NM, Manufacturer: SK), polyethylene terephthalate (PET) (dielectric constant: 3.4, loss tangent: 0.002, Product name: SW00, Manufacturer: SKC), polymethyl methacrylate (PMMA) (dielectric constant: 3.4, loss tangent: 0.002, Product name: W001AU60, Manufacturer: Sumitomo), triacetyl cellulose (TAC) (dielectric constant: 3.6, loss tangent: 0.013, Product name: KC2UAW, Manufacturer: Konica) and glass were used as the materials of the dielectric layers.

Signal loss levels (S21) (see Equation 1 above) were measured while changing the length of the electrode lines (signal length). Specifically, the signal loss levels were obtained by extracting S-parameters at 28 GHz using Network analyzer. The results are shown in FIG. 8.

Figure 8:
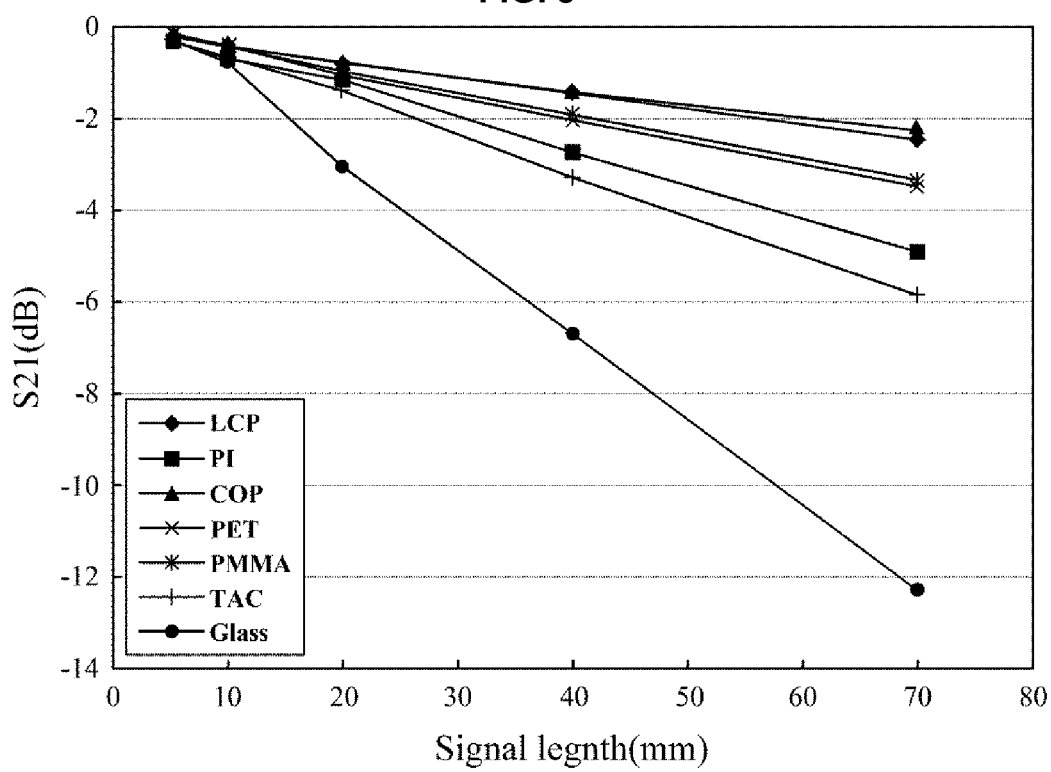
FIG. 8 is a graph showing a change of signal loss level (S21) depending on a material of a dielectric layer and a length of an electrode line in a film transmission line.

Referring to FIG. 8, in the dielectric layers including LCP and COP, S21 values were maintained as about −1.5 dB or more until the length of the electrode line was increased to 40 mm.

Experimental Example 2: Evaluation of Signal Property Depending on a Dielectric Material and a Frequency An APC electrode line having a thickness of 100 μm, a width of 5 mm and a length of 40 mm was formed on the dielectric layers of Experimental Example 1.

Signal loss levels (S21) were measured by the same method as that in Experimental Example 1 while changing frequencies with respect to the electrode line. The results are shown in FIG. 9.

Figure 9:
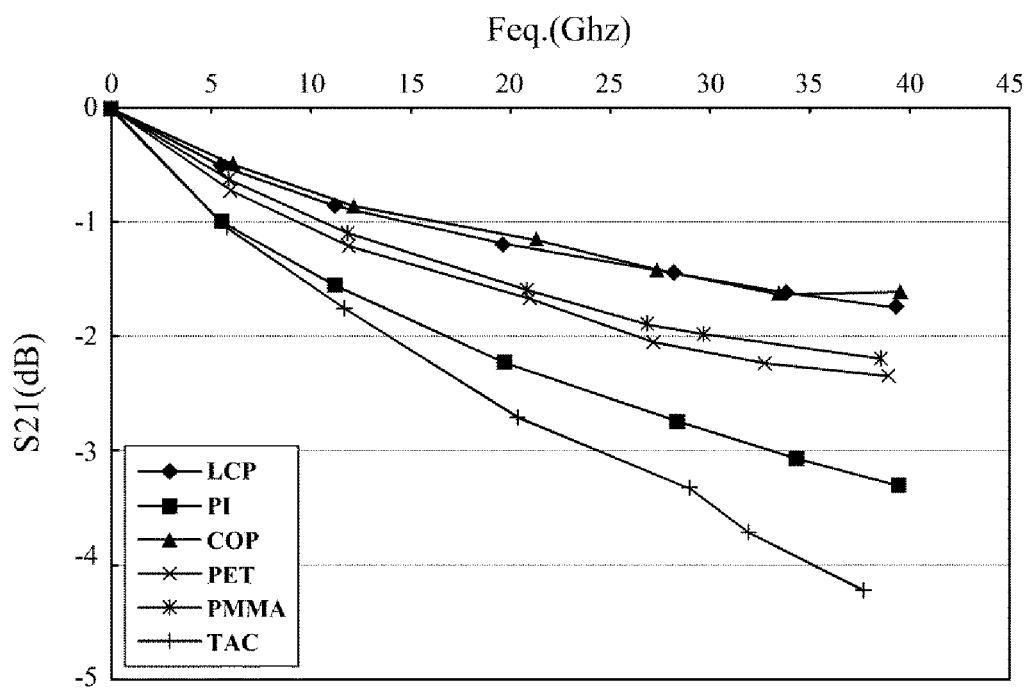
FIG. 9 is a graph showing a change of signal loss level (S21) depending on a material of a dielectric layer and a change of a driving frequency in a film transmission line.

Referring to FIG. 9, in the dielectric layers including LCP and COP, S21 values were maintained as about −1.5 dB or more within the frequency from 20 to 30 GHz.

What is claimed is:

1. An antenna comprising:
    a film transmission line comprising:
        a dielectric layer including at least one of a liquid crystal polymer (LCP) structure or a cyclo olefin polymer (COP) structure; and
        an electrode line on an upper surface of the dielectric layer; and
    an antenna electrode electrically connected to the film transmission line and disposed under a lower surface of the dielectric layer,
    wherein a signal loss level (S21) defined as an Equation 1 of the film transmission line is −1.5 dB or more at a frequency in a range from 20 GHz to 30 GHz, wherein the Equation 1 is as following:

$S21$ (dB)=10×Log(Output power/Input power).

2. The antenna according to claim 1, wherein a dielectric constant of the dielectric layer is 3.4 or less.

3. The antenna according to claim 1, wherein a loss tangent of the dielectric layer is 0.001 or less.

4. The antenna according to claim 1, wherein the dielectric layer includes at least one of structural units represented by Chemical Formulae 1 to 5 below:

[Chemical Formula 1]

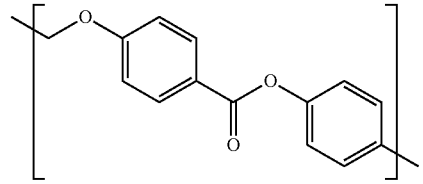

[Chemical Formula 2]

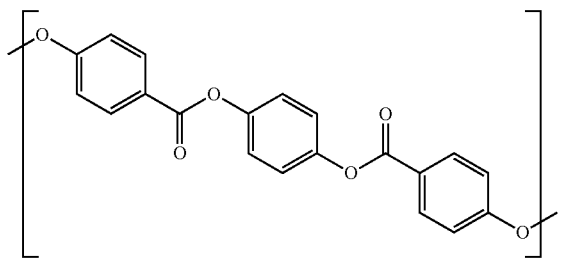

-continued

[Chemical Formula 3]

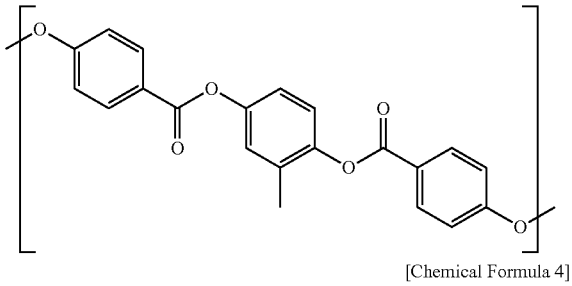

[Chemical Formula 4]

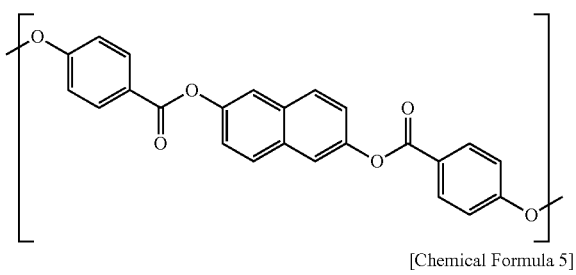

[Chemical Formula 5]

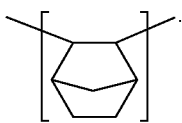

5. The antenna according to claim 1, wherein a length of the electrode line is 40 mm or less.

6. The antenna according to claim 1, wherein a thickness of the electrode line is 100 nm to 500 nm.

7. The antenna according to claim 1, wherein the electrode line includes at least one selected from the group consisting of silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca) and an alloy thereof.

8. The antenna according to claim 1, wherein the electrode line includes a signal line and a ground line.

9. The antenna according to claim 8, wherein the ground line includes a first ground line and a second ground line, and the signal line is interposed between the first ground line and the second ground line.

10. The antenna according to claim 1, wherein the electrode line includes a mesh structure.

11. The antenna according to claim 10, further comprising a dummy pattern around the electrode line,
wherein the dummy pattern includes a mesh structure the same as that of the electrode line.

12. The antenna according to claim 1, further comprising a ground layer disposed on the lower surface of the dielectric layer.

13. An image display device, comprising:
a printed circuit board;
an antenna mounted on the printed circuit board;
a display panel disposed over the printed circuit board; and
a film transmission line disposed over the display panel and electrically connected to the antenna, the film transmission line comprising a dielectric layer including at least one of a liquid crystal polymer (LCP) structure or a cyclo olefin polymer (COP) structure, and an electrode line on an upper surface of the dielectric layer,
wherein the antenna and the film transmission line are physically spaced apart from each other with the display panel interposed therebetween; and
a signal loss level (S21) defined as an Equation 1 of the film transmission line is −1.5 dB or more at a frequency in a range from 20 GHz to 30 GHz, wherein the Equation 1 is as following:

$$S21\ (dB)=10\times Log(\text{Output power/Input power}).$$

14. The image display device according to claim 13, further comprising an electronic device mounted on the printed circuit board.

15. The image display device according to claim 13, further comprising a connection structure electrically connecting the film transmission line and the antenna to each other.

16. The image display device according to claim 15, wherein the connection structure includes a flexible printed circuit board (FPCB).

17. The image display device according to claim 16, wherein the connection structure is connected to an end portion of the electrode line included in the film transmission line, and the connection structure extends toward the printed circuit board via a peripheral region of the image display device to be connected to the antenna.

* * * * *